(12) United States Patent
Yamashita et al.

(10) Patent No.: US 7,709,403 B2
(45) Date of Patent: May 4, 2010

(54) SILICON CARBIDE-OXIDE LAYERED STRUCTURE, PRODUCTION METHOD THEREOF, AND SEMICONDUCTOR DEVICE

(75) Inventors: Kenya Yamashita, Osaka (JP); Makoto Kitabatake, Nara (JP); Osamu Kusumoto, Nara (JP); Kunimasa Takahashi, Osaka (JP); Masao Uchida, Osaka (JP); Ryoko Miyanaga, Nara (JP)

(73) Assignee: Panasonic Corporation, Osaka (JP)

( * ) Notice: Subject to any disclaimer, the term of this patent is extended or adjusted under 35 U.S.C. 154(b) by 739 days.

(21) Appl. No.: 10/956,078

(22) Filed: Oct. 4, 2004

(65) Prior Publication Data

US 2005/0077569 A1    Apr. 14, 2005

(30) Foreign Application Priority Data

Oct. 9, 2003    (JP) ............................. 2003-350244

(51) Int. Cl.
*H01L 21/31* (2006.01)
*H01L 21/469* (2006.01)

(52) U.S. Cl. ....................... 438/786; 438/761; 438/787; 257/E21.267; 257/E21.303

(58) Field of Classification Search ................ 438/197, 438/787, 778, 931, 758, 769, 783, 786, FOR. 395, 438/FOR. 397, FOR. 401, 761, FOR. 385; 257/E21.266, E21.267, E21.302, E21.487, 257/E21.489, E21.293

See application file for complete search history.

(56) References Cited

U.S. PATENT DOCUMENTS 4,897,319 A * 1/1990 Sun ............................ 428/690
5,591,681 A * 1/1997 Wristers et al. ............. 438/762

(Continued)

FOREIGN PATENT DOCUMENTS

JP    10-32328    2/1998

(Continued)

OTHER PUBLICATIONS

Lipkin, L.A., et al. "Improved Oxidation Procedures for Reduced $SiO_2$/SiC Defects." Journal of Electronic Materials, vol. 25, No. 5, 1996, pp. 909-915.

(Continued)

*Primary Examiner*—Matthew Smith
*Assistant Examiner*—Quovaunda Jefferson
(74) *Attorney, Agent, or Firm*—McDermott Will & Emery LLP

(57) ABSTRACT

A gate insulating film which is an oxide layer mainly made of $SiO_2$ is formed over a silicon carbide substrate by thermal oxidation, and then, a resultant structure is annealed in an inert gas atmosphere in a chamber. Thereafter, the silicon carbide-oxide layered structure is placed in a chamber which has a vacuum pump and exposed to a reduced pressure NO gas atmosphere at a high temperature higher than 1100° C. and lower than 1250° C., whereby nitrogen is diffused in the gate insulating film. As a result, a gate insulating film which is a V-group element containing oxide layer, the lower part of which includes a high nitrogen concentration region, and the relative dielectric constant of which is 3.0 or higher, is obtained. The interface state density of an interface region between the V-group element containing oxide layer and the silicon carbide layer decreases.

3 Claims, 9 Drawing Sheets

U.S. PATENT DOCUMENTS

| | | | |
|---|---|---|---|
| 5,885,870 A * | 3/1999 | Maiti et al. | 438/261 |
| 5,972,801 A * | 10/1999 | Lipkin et al. | 438/770 |
| 6,028,012 A | 2/2000 | Wang | |
| 6,060,403 A | 5/2000 | Yasuda et al. | |
| 6,121,095 A * | 9/2000 | Tai et al. | 438/287 |
| 6,207,506 B1 * | 3/2001 | Yi et al. | 438/264 |
| 6,303,418 B1 * | 10/2001 | Cha et al. | 438/199 |
| 6,597,047 B2 * | 7/2003 | Arai et al. | 257/411 |
| 6,642,117 B1 * | 11/2003 | Chen et al. | 438/287 |
| 6,780,720 B2 * | 8/2004 | Burnham et al. | 438/287 |
| 2002/0052106 A1 * | 5/2002 | Ikura | 438/624 |
| 2002/0102358 A1 * | 8/2002 | Das et al. | 427/376.2 |
| 2002/0137300 A1 * | 9/2002 | Amos et al. | 438/381 |
| 2002/0172774 A1 | 11/2002 | Lipkin | |
| 2003/0013280 A1 * | 1/2003 | Yamanaka | 438/487 |
| 2003/0113972 A1 | 6/2003 | Hayashi et al. | |
| 2003/0160274 A1 | 8/2003 | Das et al. | |
| 2004/0067619 A1 * | 4/2004 | Niimi et al. | 438/275 |
| 2004/0101625 A1 * | 5/2004 | Das et al. | 427/378 |

FOREIGN PATENT DOCUMENTS

| | | | |
|---|---|---|---|
| JP | 2000-252461 | | 9/2000 |
| JP | 2001-210637 A | | 8/2001 |
| JP | 2001-284582 | | 10/2001 |
| WO | WO 97-17730 | | 5/1997 |
| WO | WO 99/43023 | * | 8/1999 |
| WO | WO 02/29874 | | 4/2002 |
| WO | WO 02/084727 A2 | | 10/2002 |
| WO | WO 03/047000 | | 6/2003 |

OTHER PUBLICATIONS

Chung, G.Y., et al. "Improved Inversion Channel Mobility for 4H-SIC MOSFETs Following High Temperature Anneals in Nitric Oxide." IEEE Electron Device Letters, vol. 22, No. 4, Apr. 2001, pp. 176-178.

Notice of Reasons of Rejection, dated May 23, 2008.

Interview Record, dated Jun. 8, 2008.

European Search Report issued in European Patent Application No. EP 04 02 3713, mailed Aug. 23, 2007.

Jamet, P., et al., "Physical properties of N20 and NO-nitrided gate oxides grown on 4H SIC", Applied Physics Letters, Jul. 2001, pp. 323-325, vol. 79 No. 3, American Institute of Physics, Melville NY, USA.

McDonald, K., et al., "Kinetics of NO nitridation in SiO2/4H-SiC", Journal of Applied Physics, Feb. 2003, pp. 2257-2261, vol. 93 No. 4, American Institute of Physics, New York NY, USA.

Li, H., et al., "Improved Reliability of NO-Nitrided SiO2 Grown on p-Type 4H-SiC", Aug. 1998, pp. 279-281, vol. 19 No. 8, IEEE Electron Device Letters, IEEE Service Center, New York NY, USA.

Tanner, P., et al., "SIMS Analysis of Nitrided Oxides Grown on 4H-SiC", Journal of Electronic Materials, Feb. 1999, pp. 109-111, vol. 28 No. 2, Warrendale PA, USA.

Chang, K.C., et al., "Observation of a Non-stoichiometric Layer at the Silicon Dioxide—Silicon Carbide Interface: Effect of Oxidation Temperature and Post-Oxidation Processing Conditions", Materials Research Society Symposium Proceedings, 2001, pp. H54501-H54506, vol. 640, Pittsburg PA, USA.

Lai, P.T., et al., "Interface Properties of N2O-Annealed NH3-Treated 6H-SiC MOS Capacitor", Electron Devices Meeting, Jun. 1999, pp. 46-49, IEEE, Piscataway NJ, USA.

Chakraborty, S., et al., "Interface properties of N2O-annealed SiO2/SiC system", Electron Devices Meeting, 2000, pp. 108-111, IEEE, Piscataway NJ, USA.

Lipkin, L., et al., "Insulator Investigation on Sic for Improved Reliability", IEEE Transactions on Electron Devices, Mar. 1999, pp. 525-532, vol. 46 No. 3, Piscataway NJ, USA.

Lipkin, L., et al., "Challenges and State-of-the-Art of Oxides on SiC", Materials Research Society Symposium Proceedings, 2001, vol. 640, pp. H3101-H3110, Materials Research Society, Pittsburg Pa, USA.

Cho, W., et al., "Study on electron trapping and interface states of various gate dielectric materials in 4H-SiC metal-oxide-semiconductor capacitors", Applied Physics Letters, Sep. 2000, pp. 2054-2056, vol. 77 No. 3, American Institute of Physics, Melville NY, USA.

* cited by examiner

SILICON CARBIDE-OXIDE LAYERED STRUCTURE, PRODUCTION METHOD THEREOF, AND SEMICONDUCTOR DEVICE

CROSS-REFERENCE TO RELATED APPLICATION

This application claims priority under 35 U.S.C. §119(a) on Japanese Patent Application No. 2003-350244 filed on Oct. 9, 2003, the entire contents of which are hereby incorporated by reference.

BACKGROUND OF THE INVENTION

The present invention relates to a silicon carbide-oxide layered structure including a silicon carbide layer, a production method thereof, and a semiconductor device produced by using the silicon carbide-oxide layered structure.

In recent years, applications of silicon carbide (SiC) to low-loss power devices have been expected because silicon carbide has a structure where Si and C are bonded at the composition ratio of 1:1 and has high breakdown tolerance as compared with other wide band gap semiconductor materials.

One of the most practicable applications of SiC to a power device is the application to a SiC device for power driving which has an insulated-gate transistor, i.e., a SiC-MISFET structure, wherein SiC is subjected to thermal oxidation to form a high-quality $SiO_2$ film on a SiC layer.

In order to realize a low-loss power device having a SiC-MISFET structure, it is necessary to reduce defects in a gate insulating film and an interface between a SiC layer and the gate insulating film such that the channel mobility of 200 $cm^2/Vs$ or higher is achieved.

An inverted MISFET, which is formed using a 4H—SiC (1 1-2 0) substrate whose principal surface is a (1 1-2 0) face, achieves the channel mobility of 200 $cm^2/Vs$ or higher. However, the 4H—SiC (1 1-2 0) substrate is not suitable for mass production and is therefore difficult to be used as a substrate for commercial devices.

A large number of techniques for forming a gate insulating film on a SiC (0 0 0 1) face substrate, which is suitable for mass production, have been proposed until now (see, for example, L. A. Lipkin and J. W. Palmour, J. Electron. Mater. 25, 909 (1996) and G. Y. Chung, C. C. Tin, J. R. Williams, K. McDonald, R. K. Chanana, Robert A. Weller, S. T. Pantelides, Leonard C. Feldman, O. W. Holland, M. K. Das, and John W. Palmour, "Improved Inversion Channel Mobility for 4H—SiC MOSFETs Following High Temperature Anneals in Nitric Oxide" IEEE Electron Device Lett., vol. 22, pp. 176-178, 2001). According to one of the most standard processes, a thermal oxide film is formed at a high temperature of 1100° C. or higher in a dry or wet atmosphere and annealed in an argon atmosphere, and then, the thermal oxide film is subjected to the POA in an oxygen atmosphere containing highly-concentrated water vapor at 950° C. for 3 hours, whereby a gate insulating film is formed. Under the condition where a high temperature thermal treatment is not performed for gate electrode formation, an inverted MISFET formed on a 4H—SiC (0 0 0 1) substrate having a flat surface, in which asperities are 10 nm or smaller, has the channel mobility of about 50 $cm^2/Vs$.

However, in a MISFET having a gate insulating film formed of a thermal oxide film according to the above-described standard process, a thermal treatment at 950° C. or higher in the gate electrode formation process deteriorates the actual channel mobility to 20 $cm^2/Vs$ or lower. A MISFET formed on a 4H—SiC (0 0 0 1) substrate having poor flatness, i.e., having steps over the surface, according to the above-described standard process, has the channel mobility of 10 $cm^2/Vs$ or lower. In this MISFET, the channel mobility over the surface of the SiC substrate has a large anisotropy. In this structure, a large electric current flows along the steps whereas an electric current which traverses the steps is smaller by an order of magnitude than the large electric current flowing along the steps. Thus, such problems greatly impede the application of the above techniques to commercial devices.

SUMMARY OF THE INVENTION

An objective of the present invention is to provide a silicon carbide-oxide layered structure including a high quality oxide layer on a silicon carbide layer and a production method thereof and, by extension, to realize a SiC-MISFET power device and a MIS capacitor which have high channel mobility and high current drivability.

A silicon carbide-oxide layered structure of the present invention comprises a V-group element containing oxide layer formed on a silicon carbide layer, wherein at least a lower part of the V-group element containing oxide layer includes a region where the concentration of the V-group element, such as nitrogen, phosphorus, or the like, is high, and the relative dielectric constant is equal to or higher than 3.0.

With the above structure, the interface state deteriorates in a region near the interface between the V-group element containing oxide layer and the silicon carbide layer, and high dielectric constant is obtained. Thus, when the silicon carbide-oxide layered structure is used in a MISFET, high electric current drivability and high carrier mobility are obtained.

Preferably, the half-width of a peak portion in the concentration distribution of the V-group element in the lower part of the V-group element containing oxide layer is equal to or smaller than 5 nm.

Preferably, the base material of the V-group element containing oxide layer is a $SiO_2$ film formed by thermal oxidation.

In the case where the V-group element is nitrogen or phosphorus, the maximum value of the concentration of the V-group element in the lower part of the V-group element containing oxide layer is equal to or higher than $1 \times 10^{20}$ $cm^{-3}$ and equal to or lower than $1 \times 10^{22}$ $cm^{-3}$. With this feature, the effect of improving the relative dielectric constant and the effect of decreasing the interface state density are significantly large.

The interface state density of the V-group element containing oxide layer in a region near the interface between the V-group element containing oxide layer and the silicon carbide layer is equal to or lower than $1 \times 10^{12}$ $cm^{-3}/eV$ in a region of 0.15 to 0.4 eV from a band edge of at least any of the conduction band and the valence band.

In a semiconductor device of the present invention, a V-group element containing oxide layer is formed on a silicon carbide layer, and a gate electrode is provided on the V-group element containing oxide layer. The silicon carbide layer includes a first conductivity type impurity diffusion region, a channel region, and a second conductivity type contact region provided at a position opposite to the channel region with respect to the impurity diffusion region interposed therebetween, a surface portion of the second conductivity type contact region having been removed by etching.

In the above structure, a portion of the contact region in which the concentration of the V-group element is high is removed. Thus, a semiconductor device having high channel mobility is obtained.

The first method of the present invention for forming a silicon carbide-oxide layered structure comprises the steps of: forming an oxide layer on a surface of a silicon carbide layer; and thereafter, exposing the oxide layer to an atmosphere including a V-group element containing gas at a temperature higher than 1100° C. and lower than 1250° C. such that the oxide layer changes into a V-group element containing oxide layer which has the relative dielectric constant of 3.0 or higher.

With the above method, the V-group element is efficiently diffused in the V-group element containing oxide layer while deterioration in the characteristics of the V-group element containing oxide layer is prevented. Thus, the interface state deteriorates in a region near the interface between the V-group element containing oxide layer and the silicon carbide layer, and high dielectric constant is obtained. Therefore, the first production method of the present invention is useful for the formation of a MISFET having high electric current drivability and high carrier mobility.

Preferably, the atmosphere including a V-group element containing gas is a reduced pressure atmosphere equal to or higher than $6.67 \times 10^3$ Pa and equal to or lower than $5.33 \times 10^4$ Pa.

After the oxide is formed by thermal oxidation, the oxide layer is annealed in an inert gas atmosphere in order to expose the oxide layer to a gas containing a V-group element containing gas, whereby the oxide layer results in a denser film.

Preferably, at the step of forming the oxide film, an oxidation treatment is performed in an oxidizing gas atmosphere at a temperature equal to or higher than 850° C. and equal to or lower than 950° C. after the annealing in the inert gas atmosphere.

The V-group element containing gas preferably contains nitrogen or phosphorus. In such a case, at least one selected from a group consisting of NO gas, $N_2O$ gas, $NO_2$ gas and $PH_3$ gas is preferably used as the V-group element containing gas.

The second method of the present invention for forming a silicon carbide-oxide layered structure comprises the steps of: forming a first oxide layer on a surface of a silicon carbide layer; exposing the first oxide layer to a gas atmosphere including a V-group element containing gas; forming a second oxide layer; and annealing the structure at a temperature equal to or higher than 900° C. and equal to or lower than 1100° C. in an inert gas atmosphere, such that an oxide layer including the first and second oxide layers changes into a V-group element containing oxide layer which has the relative dielectric constant of 3.0 or higher.

With the above method, the V-group element is efficiently diffused in the V-group element containing oxide layer while deterioration in the characteristics of the oxide layer is prevented. Thus, the interface state deteriorates in a region near the interface between the V-group element containing oxide layer and the silicon carbide layer, and high dielectric constant is obtained. Therefore, the second production method of the present invention is useful for the formation of a MISFET having high electric current drivability and high carrier mobility.

Preferably, the atmosphere including a V-group element containing gas is a reduced pressure atmosphere equal to or higher than $6.67 \times 10^3$ Pa and equal to or lower than $5.33 \times 10^4$ Pa.

At the step of forming the oxide layer, forming a thermal oxide film having a thickness smaller than 20 m is preferable. At the step of exposing the oxide layer to the gas atmosphere including a V-group element containing gas, at least one selected from a group consisting of NO gas, $N_2O$ gas, $NO_2$ gas and $PH_3$ gas is preferably used as the V-group element containing gas.

A silicon carbide-oxide layered structure or production method thereof according to the present invention serves to produce a MISFET having high electric current drivability and high carrier mobility, or the like.

DESCRIPTION OF THE PREFERRED EMBODIMENTS

Embodiments of the present invention will be described by illustrating a method for forming a silicon carbide-oxide layered structure wherein a V-group element containing oxide layer having desirable characteristics is provided on a silicon carbide (SiC) layer.

Embodiment 1

Figure 1:
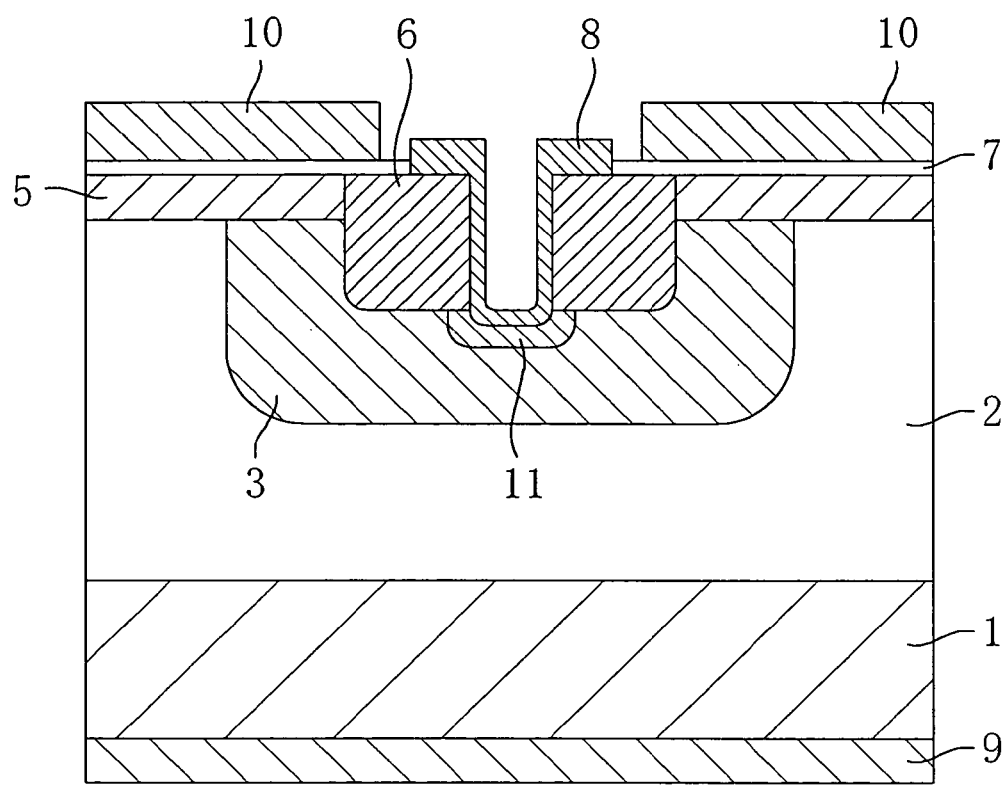
FIG. 1 is a cross-sectional view showing a structure of an inverted MISFET which uses a SiC substrate according to embodiment 1 of the present invention.
Figure 10:
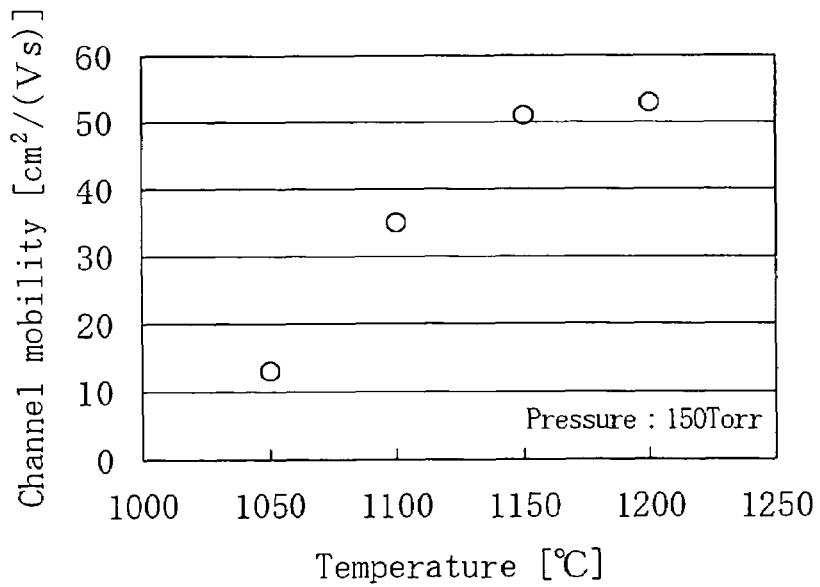
FIG. 10 shows the NO-annealing temperature dependency of the channel mobility of a MISFET of embodiment 1.

FIG. 1 is a cross-sectional view showing a structure of an accumulative MISFET which uses a SiC substrate according to embodiment 1 of the present invention. Although only a partial cross section of the structure is shown in FIG. 1, a plan view of the MISFET is as shown in FIG. 2 or FIG. 10 of PCT/JP01/07810.

In embodiment 1, nitrogen is used as a V-group element. However, any other V-group element, such as phosphorus (P), arsenic (As), or the like, may be used.

In the present invention, a "SiC (silicon carbide) layer" means most preferably a bulk monocrystalline SiC substrate or a SiC layer epitaxially grown on a bulk monocrystalline SiC substrate. SiC has many polytypes, among which 3C, 4H, 6H and 15R polytypes are especially useful for electronic devices. When these polytypes are used, the present invention brings adequate results. In the description provided below, the SiC layer is a 4H—SiC (0 0 0 1) layer epitaxially grown on a bulk SiC substrate.

The double implantation MISFET shown in FIG. 1 includes: a low-resistance SiC substrate 1 containing an n-type impurity (dopant) at a concentration of $1\times10^{18}$ cm$^{-3}$ or higher; a high-resistance SiC layer 2 provided on the principal surface of the SiC substrate 1 and doped with an n-type impurity of about $1\times10^{15}$ cm$^{-3}$ to $1\times10^{16}$ cm$^{-3}$; a p-well region 3 formed on a portion of the surface of the high-resistance SiC layer 2, which is doped with a p-type impurity of about $1\times10^{16}$ cm$^{-3}$ to $1\times10^{18}$ cm$^{-3}$; a source region 6 formed on a portion of the p-well region 3, which is doped with an n-type impurity of about $1\times10^{19}$ cm$^{-3}$; a p$^+$-contact region 11 formed on a portion of the p-well region 3 immediately under the source region, which is doped with a p-type impurity of high concentration; a channel layer 5 including a layered doped layer structure extending over the p-well region 3 and the SiC layer 2; a gate insulating film (V-group element containing oxide layer) 7 formed of a thermal oxide layer on the surface of the channel layer 5; a gate electrode 10 formed of an Al alloy film on the gate insulating film 7; a source electrode 8 provided on the wall of a trench which penetrates through the source region 6 to reach the p$^+$-contact region 11, such that the source electrode 8 is in contact with the p$^+$-contact region 11 and the gate insulating film 7; and a drain electrode 9 formed over the back surface of the SiC substrate 1 to be in ohmic contact with the SiC substrate 1.

The source region 6 and the SiC layer 2, each of which is the n-type semiconductor layer, are electrically connected with each other through the channel layer 5. The channel layer 5 is not provided in an area above the source region. The source electrode 8, the source region 6 and the p$^+$-contact region 11 are thermally treated to be in ohmic contact with one another. The SiC substrate 1 and the drain electrode 9 are in ohmic contact with each other.

FIGS. 2A to 2E and FIGS. 3A to 3E are cross-sectional views showing the process of producing the MISFET of embodiment 1.

Figure 2A:
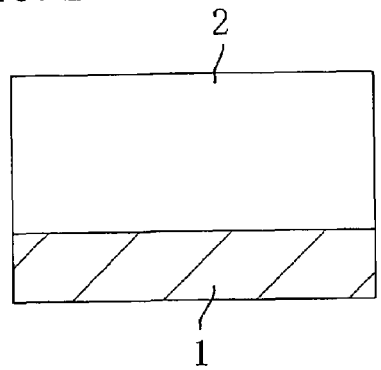
FIGS. 2A to 2E are cross-sectional views showing the first half of the process of producing the MISFET of embodiment 1.

At the step of FIG. 2A, a high-resistance SiC layer 2 is epitaxially grown over a low-resistance SiC substrate 1 such that the SiC layer 2 has a higher resistance, i.e., a lower dopant concentration, than that of the SiC substrate 1.

Figure 2B:
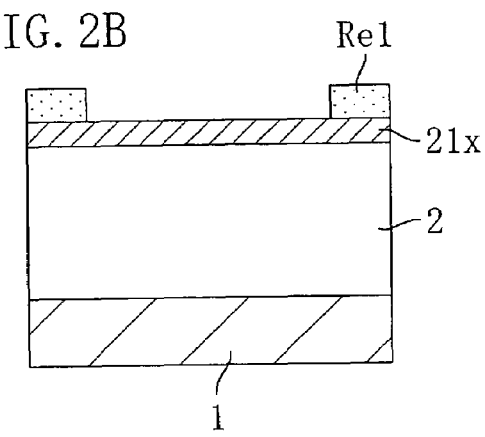

Then, at the step of FIG. 2B, for example, a TEOS film is deposited to form a silicon dioxide film 21x having a thickness of 3 μm over the high-resistance SiC layer 2. Thereafter, photolithography is performed to form a resist mask Re1 which has an opening in a P-well formation region over the silicon dioxide film 21x.

Figure 2C:
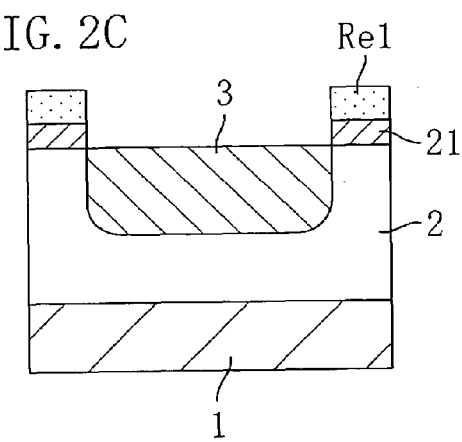

Then, at the step of FIG. 2C, the silicon dioxide film 21x is patterned by dry etching using the resist mask Re1 as an etching mask to form a silicon dioxide mask (ion implantation mask) 21. The resist mask Re1 is then removed. Thereafter, ion implantation is performed with p-type impurities in a portion of the surface of the high-resistance SiC layer 2 using the silicon dioxide mask 21 while the substrate is kept at a high temperature of 500° C. or higher, whereby a p-well region 3 is formed. In general, the concentration of the p-type impurities is about $1\times10^{17}$ cm$^{-3}$ to $1\times10^{18}$ cm$^{-3}$. The depth of the p-well region 3 is about 1 μm in order to avoid pinch-off.

Figure 2D:
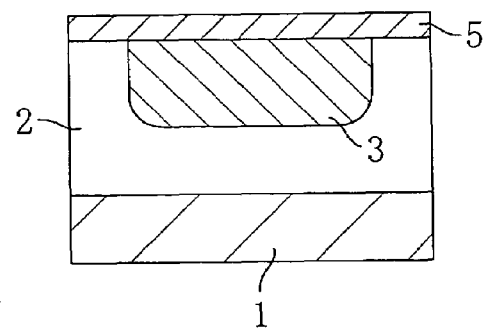

Then, at the step of FIG. 2D, the silicon dioxide mask 21 is removed, and annealing is performed to activate the implanted impurities. Thereafter, a channel layer 5 containing n-type impurities is epitaxially grown over the surface of the p-well region 3 and the high-resistance SiC layer 2.

Figure 2E:
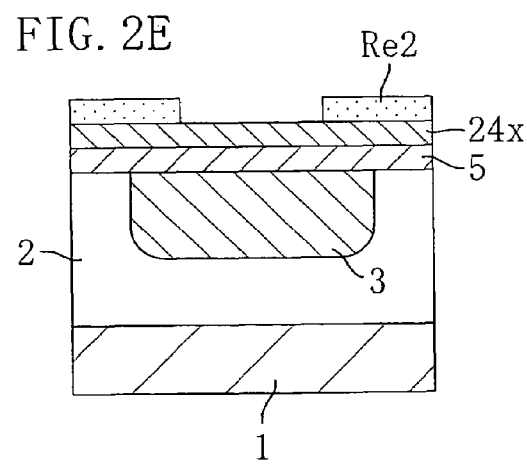

Then, at the step of FIG. 2E, for example, a TEOS film is deposited to form a silicon dioxide film 24x having a thickness of 3 μm over the channel layer 5. Thereafter, photolithography is performed to form a resist mask Re2 which has an opening in a source formation region over the silicon dioxide film 24x.

Figure 3A:
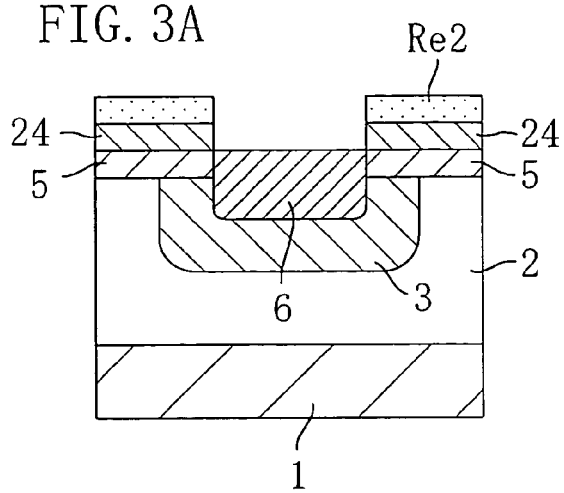
FIGS. 3A to 3E are cross-sectional views showing the second half of the process of producing the MISFET of embodiment 1.

Then, at the step of FIG. 3A, the silicon dioxide film 24x is patterned by dry etching using the resist mask Re2 as an etching mask to form a silicon dioxide mask (ion implantation mask) 24. The resist mask Re2 is then removed. Thereafter, ion implantation is performed with n-type impurities of high concentration in part of the channel layer 5 and the p-well region 3 using the silicon dioxide mask 24 while the substrate is kept at a high temperature of 500° C. or higher, whereby a source region 6 which penetrates through the channel layer 5 to reach the inside of the p-well region 3 is formed. At this point in time, the source region 6 and the high-resistance SiC layer 2, each of which is a n-type semiconductor layer, are electrically connected to each other through the channel layer 5 which is a n-type semiconductor layer.

Figure 3B:
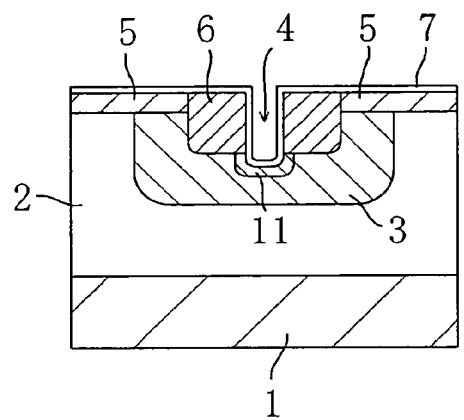

Then, at the step of FIG. 3B, ion implantation is performed with p-type impurities of high concentration to form a p$^+$-contact region 11 in a portion of the p-well region 3 immediately under the source region 6. Then, the silicon dioxide mask 24 is removed, and annealing is performed to activate the impurities implanted in the p$^+$-contact region 11 and the source region 6. A trench 4 which penetrates through the source region 6 to reach an upper portion of the p$^+$-contact region 11 is formed. Thereafter, exposed surfaces of the channel layer 5, the source region 6 and the p$^+$-contact region 11 are subjected to thermal oxidation to form a thermal oxide film. The thermal oxide film is formed in a dry atmosphere of 1200° C. or higher to have a thickness of 40 nm to 80 nm. As a result, a silicon carbide-oxide layered structure A is obtained. The thermal oxide film is annealed in a NO gas (V-group element containing gas). With this nitriding treatment, nitrogen, i.e., a V-group element, is introduced into the thermal oxide film to form a gate insulating film 7 which is a V-group element containing oxide layer. The nitriding treatment is performed at a temperature of 1050° C. to 1250° C. with the treatment pressure of $6.67\times10^3$ Pa to $5.33\times10^4$ Pa.

Figure 3C:
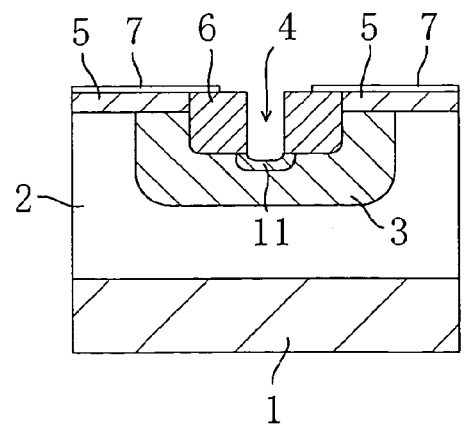

Then, at the step of FIG. 3C, the gate insulating film 7 is removed from the wall of the trench 4 and an area around the trench 4. Thereafter, the source region 6 and the p$^+$-contact region 11, which have been exposed by removing the gate insulating film 7, are wet-etched to a depth of about 300 nm, whereby a portion having a high interface state density is removed.

Figure 3D:
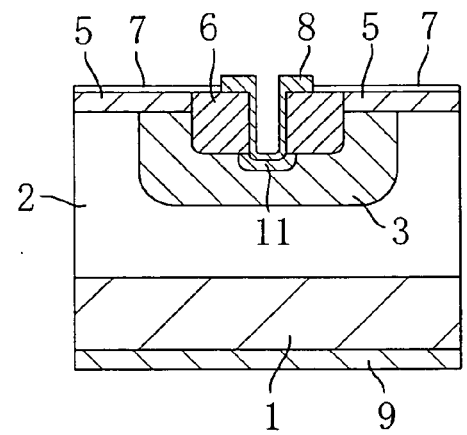

Then, at the step of FIG. 3D, a source electrode 8 is formed over an exposed portion of the source region 6 which has been exposed as a result of removal of the gate insulating film 7. Further, a drain electrode 9 is formed over the back surface of the SiC substrate 1.

Figure 3E:
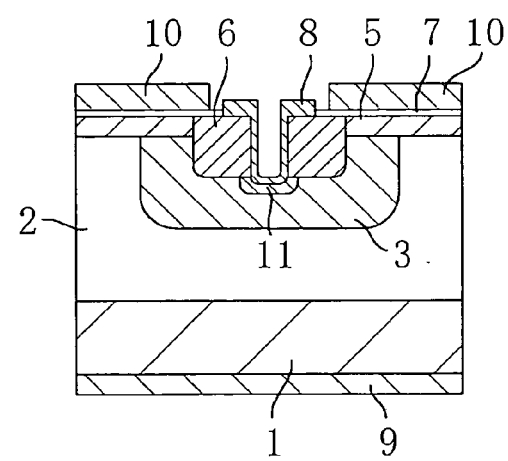

Then, at the step of FIG. 3E, a gate electrode 10 is formed on the gate insulating film 7. It should be noted that a thermal treatment is performed such that the source electrode 8 is in ohmic contact with the gate insulating film 7 and the p$^+$-contact region 11, and the SiC substrate 1 is in ohmic contact with the drain electrode 9.

The NO annealing step of FIG. 3B in the above production process is now described.

Figure 4A:
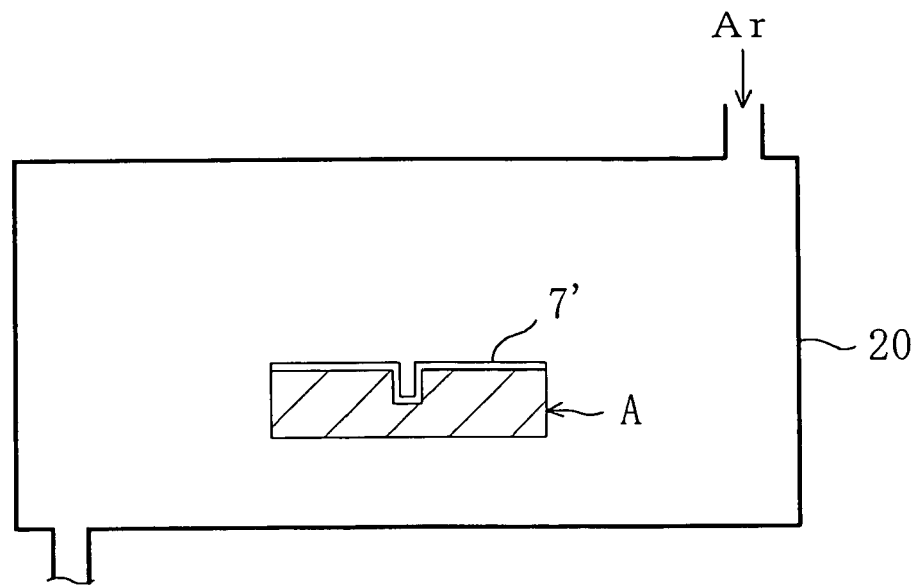
FIGS. 4A and 4B are cross-sectional views showing the steps of forming a V-group element containing oxide layer according to embodiment 1.
Figure 4B:
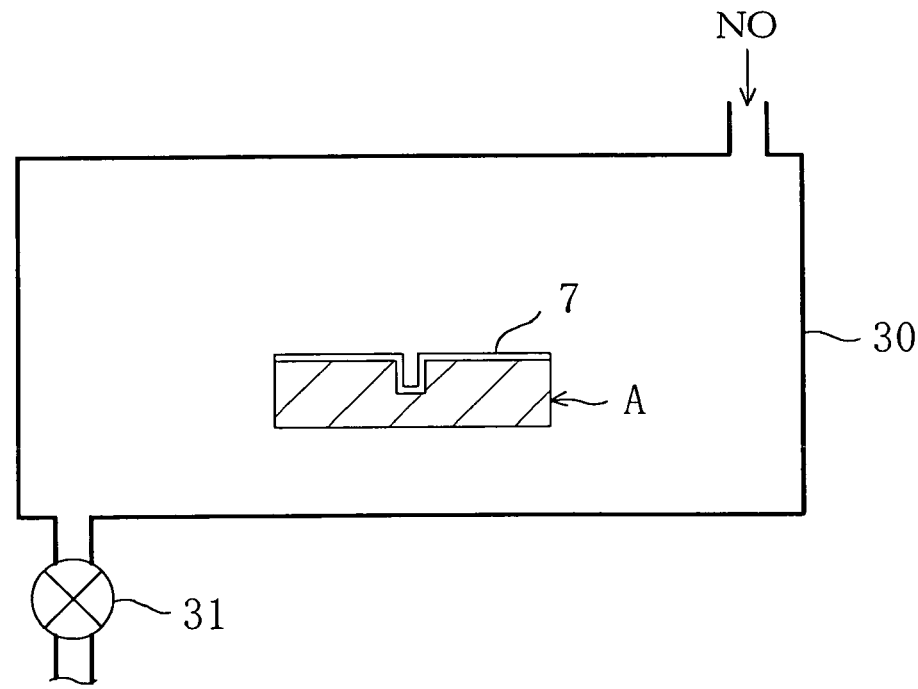

FIGS. 4A and 4B are cross-sectional views showing the steps of forming a V-group element containing oxide layer (gate insulating film 7) according to embodiment 1. In FIGS. 4A and 4B, a silicon carbide-oxide layered structure is schematically shown. In embodiment 1, nitrogen is used as a V-group element. However, any other V-group element, such as phosphorus (P), arsenic (As), or the like, may be used.

At the step shown in FIG. 4A, the silicon carbide-oxide layered structure A over which a gate insulating film 7' has been formed is placed in a chamber 20 and annealed in an inert gas (Ar, N2, He, Ne, or the like) atmosphere at 1000° C. or higher (for example, 1000° C. to 1300° C.). The gate insulating film 7', which is a thermal oxide film, is densified in advance by this annealing treatment. At this point in time, a treatment for introducing a V-group element is not yet performed on the gate insulating film 7'.

Then, at the step of FIG. 4B, the silicon carbide-oxide layered structure A is moved into a chamber 30 having an exclusion device (not shown) and a vacuum pump 31 which is a pressure reduction device. Then, NO gas (or a gas containing a V-group element other than nitrogen (e.g., phosphorus (P)) is introduced into the chamber 30 at a flow rate of 500 (ml/min) while the inside pressure of the chamber 30 is reduced by the vacuum pump 31 to about 150 Torr ($2.0 \times 10^4$ Pa), and the inside of the chamber 30 is heated to a temperature sufficient for nitrogen (or a V-group element other than nitrogen) to be diffused in the gate insulating film 7' (e.g., about 1150° C.). Under the reduce pressure condition, the gate insulating film 7' is exposed to the V-group element containing gas, whereby a V-group element, such as nitrogen, or the like, is diffused in the gate insulating film 7'. As a result, a gate insulating film 7, which is a denser V-group element containing oxide layer having a large relative dielectric constant, is obtained. The exposure is performed for a time period which is sufficient for forming the dense V-group element containing oxide layer and sufficient for obtaining improved characteristics of the gate insulating film (V-group element containing oxide layer) 7 (e.g., 1 hour).

Figure 5:
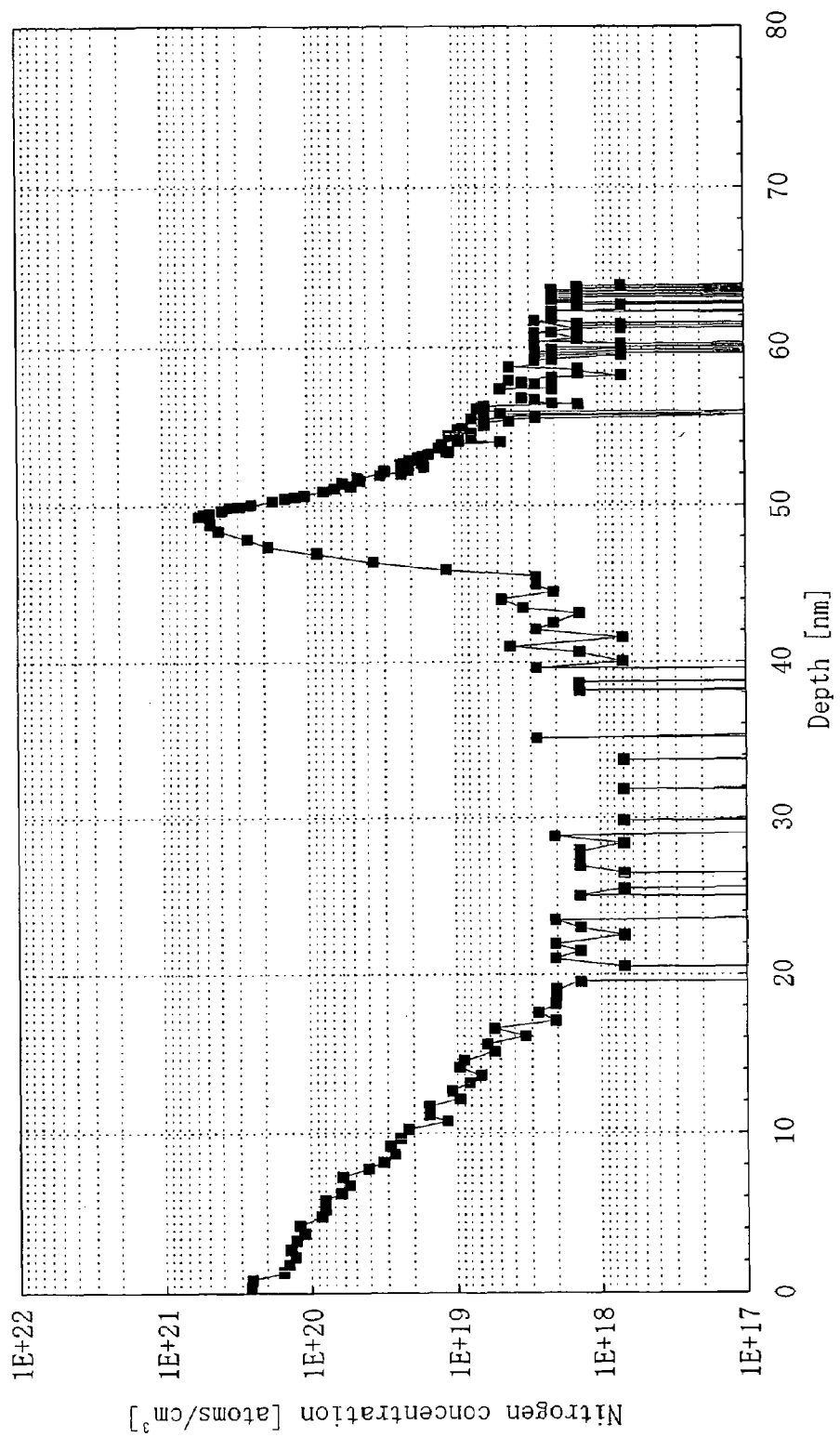
FIG. 5 shows the nitrogen concentration profile where the nitrogen concentration in the thickness direction of an oxide layer formed according to the production method of embodiment 1 was measured by SIMS.

FIG. 5 shows the nitrogen concentration profile where the nitrogen concentration in the thickness direction of the gate insulating film 7, which is a V-group element containing oxide layer formed according to the production method of embodiment 1, was measured by SIMS. In the data of FIG. 5, the thickness of the gate insulating film (V-group element containing oxide layer) 7 was about 50 nm. As shown in FIG. 5, because of the exposure treatment to the NO gas, nitrogen was diffused in the gate insulating film (V-group element containing oxide layer) 7. Especially in a portion of the gate insulating film (V-group element containing oxide layer) 7 near the underlying SiC layer (the source region 6 or the $p^+$-contact region 11), the nitrogen concentration was $6 \times 10^{20}$ atoms/$10^3$, which resulted in a steep peak portion in the profile of FIG. 5. The length of the peak portion in the thickness direction was about 3 nm at half-width. The relative dielectric constant of the entire gate insulating film (V-group element containing oxide layer) 7 was about 3.3.

Figure 6:
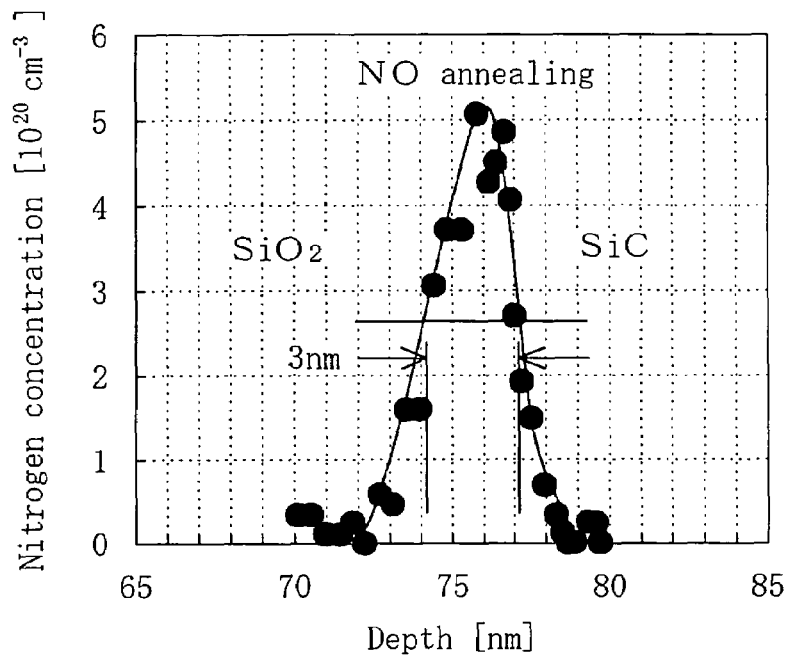
FIG. 6 shows the concentration distribution of a peak portion (region near the $SiO_2$—SiC interface) extracted from a nitrogen concentration profile.

FIG. 6 shows the concentration distribution of the peak portion (region near the $SiO_2$—SiC interface) which was extracted from the nitrogen concentration profile obtained from a sample different from the sample from which the data of FIG. 5 was obtained. In the sample used herein, the V-group element containing oxide layer was thicker than that of the sample of FIG. 5. The data shown in FIG. 5 was obtained by quantitating nitrogen in the $SiO_2$—SiC interface with $CsN^{147}$.

As shown in FIG. 6, the half-width of the peak portion was 3 nm, from which it is seen that nitrogen was introduced in a very narrow area with high concentration. The half-width of the peak portion is preferably 5 nm or smaller.

Thus, by introducing a V-group element, such as nitrogen, phosphorus (P), or the like, into an oxide layer, a V-group element containing oxide layer having a high relative dielectric constant is obtained. In a MISFET having the gate insulating film 7 which is the V-group element containing oxide layer of embodiment 1, a gate bias efficiently acts upon an underlying layer, so that high electric current drivability is achieved.

Also in the case where a MIS capacitor is formed using a V-group element containing oxide layer as a capacitance insulating film, a MIS capacitor having a high relative dielectric constant is formed on a SiC substrate.

Figure 7:
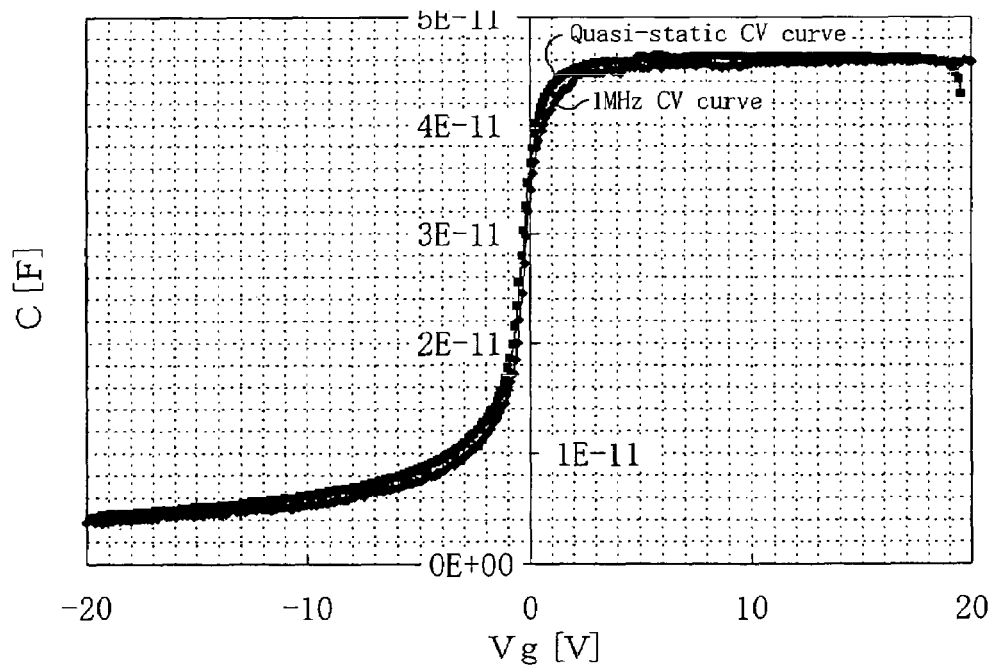
FIG. 7 shows a result of CV measurement performed on a MIS capacitor which includes a gate insulating film (V-group element containing oxide layer) formed according to the method of embodiment 1 as a capacitance insulating film.

FIG. 7 shows a result of CV measurement performed on a MIS capacitor which includes the gate insulating film (V-group element containing oxide layer) 7 formed according to the method of embodiment 1 as a capacitance insulating film (a capacitor formed by the gate electrode 10, the gate insulating film 7 and the channel layer 5). In the graph of FIG. 7, the horizontal axis indicates the voltage between electrodes, and the vertical axis indicates the capacitance. This sample was subjected to a thermal treatment at 950° C. or higher when the gate electrode 10, which is the upper electrode of the capacitor, was formed on the gate insulating film (V-group element containing oxide layer) 7. Comparing the Quasi-static CV curve with a CV curve measured at a high frequency (1 MHz) in FIG. 7, it is seen that the difference between these curves is very small, i.e., the interface state density was decreased.

Figure 8A:
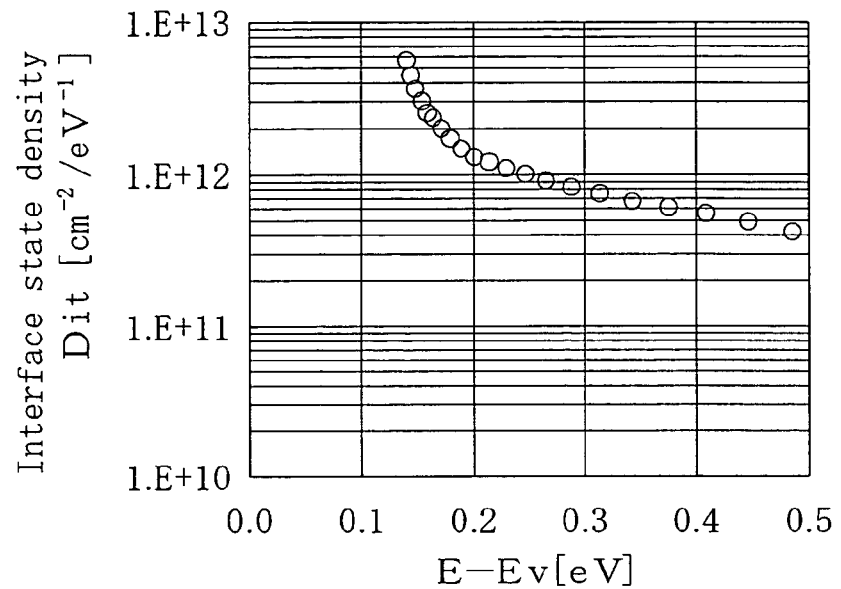
FIGS. 8A and 8B show the interface state density calculated using the High-Low method based on the data shown in FIG. 6.
Figure 8B:
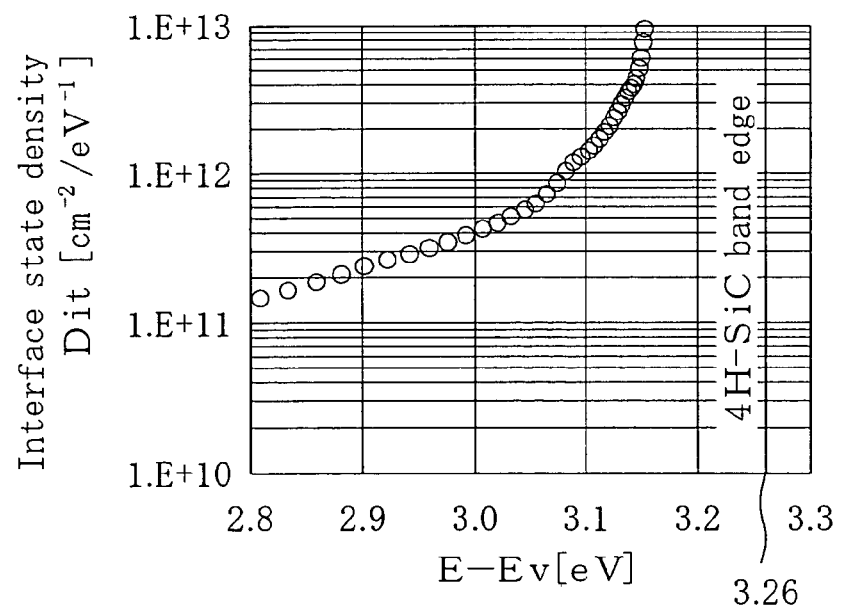

FIGS. 8A and 8B show the interface state density calculated using the High-Low method based on the data shown in FIG. 6. In the graphs of FIGS. 8A and 8B, the horizontal axis indicates the potential difference from valence band Ev (E–Ev (eV)), and the vertical axis indicates interface state density Dit ($cm^{-2}eV^{-1}$). In the case where the carrier is an electron (N-channel MISFET), the interface state which functions as a trap is an interface state in the potential range near the conduction band edge (E–Ev=2.95 eV to 3.05 eV). In the case where the carrier is a hole (P-channel MISFET), the interface state which functions as a hole trap is an interface state in the potential range near the valence band edge (E–Ev=0.3 eV to 0.4 eV). However, as shown in FIGS. 8A and 8B, in embodiment 1, the interface state density of $1 \times 10^{12}$ $cm^{-2} \cdot eV^{-1}$ or lower was obtained in the potential range near each band edge. The average nitrogen concentration in the entire gate insulating film (V-group element containing oxide layer) 7 was $8.3 \times 10^{19}$ $cm^{-3}$.

Thus, it is seen that when a MIS capacitor is formed using a V-group element containing oxide layer as a capacitance insulating film, the interface state density is decreased in a region near the interface between the capacitance insulating film and the SiC layer (lower electrode).

Therefore, even when a MISFET is formed using the MIS capacitor, the interface state density which functions as a carrier trap is decreased, and accordingly, the carrier mobility is improved.

Especially because the maximum value of the nitrogen concentration in the lower part of the gate insulating film (V-group element containing oxide layer) 7 is equal to or higher than $1 \times 10^{20}$ $cm^{-3}$ and equal to or lower than $1 \times 10^{22}$ $cm^{-3}$, the effect of improving the relative dielectric constant and the effect of decreasing the interface state density are significantly large.

—Preferred Conditions in the Step of FIG. 4B—

The gas containing nitrogen which is used in the step of FIG. 4B is, for example, NO gas, $N_2O$ gas, $NO_2$ gas, $PH_3$ gas, or the like. Especially, a great effect is produced when NO gas or $N_2O$ gas is used. That is, a gas actually optimum as a gas containing nitrogen is NO gas and $N_2O$, which also contain oxygen. When any of these gases is used, the following conditions are preferred in view of suppressing oxidation of an underlying SiC layer.

[Pressure Condition]

Figure 9:
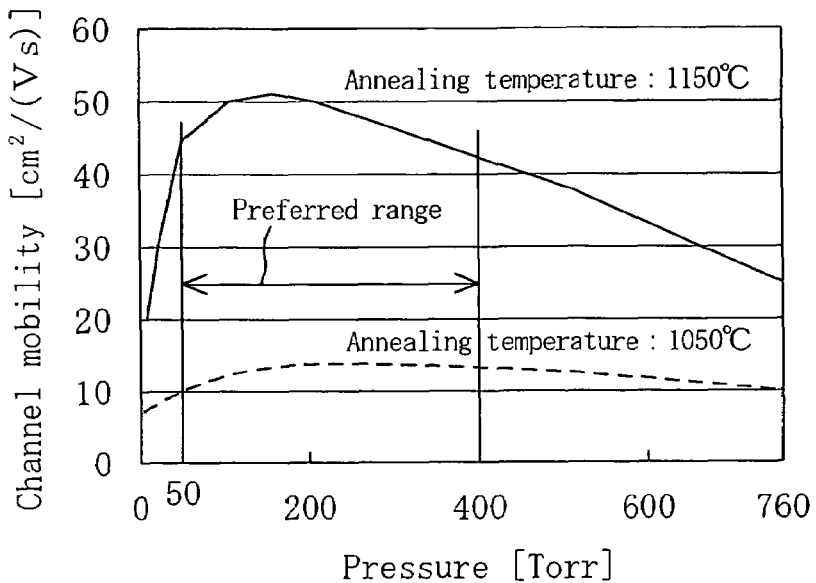
FIG. 9 shows the pressure dependency of the channel mobility of the MISFET of embodiment 1 in the NO-annealing.

FIG. 9 shows the pressure dependency of the channel mobility of a MISFET of embodiment 1 in the NO-annealing. FIG. 9 is a graph for a sample which was subjected to annealing with a temperature varying in the range of 1050° C. to 1150° C. The channel mobility exhibits the highest value when the gate bias is in the range of 5 V to 20 V, and thus, FIG. 9 shows the data obtained with such a gate bias range.

As seen from FIG. 9, high channel mobility was obtained in the range (preferred range) of 50 Torr to 400 Torr ($6.67 \times 10^3$ Pa to $5.33 \times 10^4$ Pa)). The peak position is about 150 Torr ($2.0 \times 10^4$ Pa), the reason of which is described below.

In the thermal oxidation of the SiC layer at the step of FIG. 4B, or in the deposition of an oxide, a monocrystalline SiC substrate or an epilayer (epitaxially-grown SiC layer) is generally provided along the silicon face and carbon face or along one of the A axes perpendicular to the silicon face or carbon face (e.g., [1 1 2 0] direction or [1 1 0 0] direction). Carbon (C) is oxidized more readily than silicon (Si) (therefore, oxidation of carbon is faster when all of the other factors are substantially the same). Oxidation on the carbon face advances at a temperature of 900° C. to 1300° C., whereas oxidation on the silicon face advances at a temperature of 1000° C. to 1400° C.

Thus, at the step shown in FIG. 4B, even when a gas containing both oxygen and nitrogen is used as the nitrogen-containing gas, oxidation on the carbon surface advances at a temperature of 900° C. to 1300° C., and oxidation on the silicon face advances at a temperature of 1000° C. to 1400° C. This also applies to an example where a gas containing a V-group element other than nitrogen is used.

As described above, in an atmosphere containing oxygen, oxidation of SiC is generally observed at 900° C. or higher. However, even at a temperature of 900° C. or higher, both oxidation on the carbon face and oxidation on the silicon face are suppressed under a reduced pressure condition. Especially under a pressure of 400 Torr ($5.33 \times 10^4$ Pa) or lower, oxidation advances so that the effect of improving the channel mobility deteriorates. Especially when an oxide layer (gate insulating film 7') is annealed with a gas containing both nitrogen and oxygen, e.g., NO gas used in embodiment 1, the process is preferably performed in a reduced pressure condition, specifically, under a pressure of 400 Torr ($5.33 \times 10^4$ Pa) or lower. However, diffusion of nitrogen in the oxide layer (gate insulating film 7') is suppressed in an excessively-reduced pressure atmosphere. Thus, the process is preferably performed under a pressure of 50 Torr ($6.67 \times 10^3$ Pa) or higher. Therefore, the process of exposing the oxide layer to a gas containing nitrogen as shown in FIG. 4B is preferably performed under a pressure equal to or higher than $6.67 \times 10^3$ Pa and equal to or lower than $5.33 \times 10^4$ Pa.

It should be noted that even when inert gas (Ar gas or $N_2$ gas) is also introduced into the chamber and the pressure of the entire atmosphere is the atmospheric pressure or a reduced pressure close to the atmospheric pressure, the above-described effects of embodiment 1 are achieved so long as the partial pressure of the V-group element containing gas is equal to or higher than $6.67 \times 10^3$ Pa and equal to or lower than $5.33 \times 10^4$ Pa.

[Temperature Condition]

FIG. 10 shows the NO-annealing temperature dependency of the channel mobility of a MISFET of embodiment 1. FIG. 10 is a graph for a sample which was subjected to annealing for 1 hour at a pressure of 150 Torr ($2.00 \times 10^4$ Pa). As seen from FIG. 10, relatively high channel mobility is obtained at a temperature higher than 1100° C. and lower than 1250° C., more preferably, at a temperature equal to or higher than 1150° C. and equal to or lower than 1200° C., the reason of which is described below.

It has already been found that, in general, if the exposure process to a gas containing nitrogen is performed at 1100° C. or higher, nitrogen is quickly diffused in the oxide layer (gate insulating film 7'). It should be noted that the temperature is preferably 1250° C. or lower in order to suppress diffusion of oxygen in the oxide layer.

Figure 11:
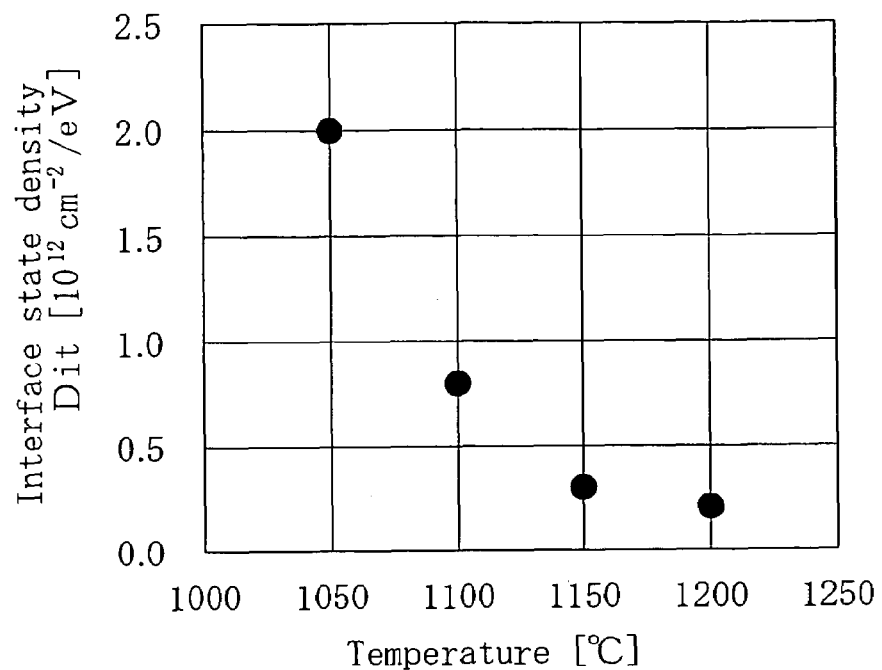
FIG. 11 shows the NO-annealing temperature dependency of the interface state density of a MISFET of embodiment 1.

FIG. 11 shows the NO-annealing temperature dependency of the interface state density of a MISFET of embodiment 1. FIG. 11 shows the interface state density at the potential position (E−Ev) of 3.0 eV for a sample which was subjected to annealing for 1 hour at a pressure of 150 Torr ($2.00 \times 10^4$ Pa). As seen from FIG. 11, the interface state density is very small at a temperature higher than 1100° C. and lower than 1250° C., more preferably, at a temperature equal to or higher than 1150° C. and equal to or lower than 1200° C. Therefore, it is seen from this result that the high channel mobility is obtained with such a temperature range.

Thus, a preferred temperature range at the step of FIG. 4B is 1100° C. to 1250° C., and more preferably, 1150° C. to 1200° C. This also applies to the case where a V-group element other than nitrogen, e.g., phosphorus (P), is used.

In general, the surface of the oxide layer is unlikely to be rough at 1300° C. or lower.

In embodiment 1, the oxide layer (gate insulating film 7') formed over the SiC layer (the channel layer 5, the source region 6 and the p⁺-contact region 11) is subjected to thermal oxidation. However, it is not always necessary to form the oxide layer by thermal oxidation. It is possible to form an oxide layer over the SiC layer using any other method (for example, formation of the oxide layer by the low pressure chemical vapor deposition (LPCVD) or plasma deposition with silane bath ($SiH_4$) and oxygen ($O_2$), or any combination of CVD, deposition and thermal oxidation).

In embodiment 1, the accumulative MISFET has been described, but the above example of the accumulative MISFET is provided for merely estimating the interface state density itself according to the channel mobility of the accumulative MISFET. Thus, it is seen that high channel mobility is obtained under the conditions of embodiment 1 even in an inverted MISFET.

Embodiment 2

In embodiment 2, the structure of a silicon carbide-oxide layered structure is basically the same as that of embodiment 1, and therefore, the description thereof is herein omitted. Only the production process of embodiment 2 is described in this section.

In embodiment 2, a first oxide layer is formed over the surface of the SiC layer before the step of FIG. 4B. The thickness of the first oxide layer is preferably smaller than 20 nm, e.g., about 8 nm. Thereafter, the structure is annealed in an inert gas (Ar, $N_2$, He, Ne, or the like) atmosphere at 1000° C. or higher (e.g., 1000° C. to 1150° C.). The first oxide layer is densified in advance by this annealing treatment.

Then, the structure is annealed for 1 hour with a gas containing nitrogen, such as NO gas, $N_2O$ gas, or the like, or a gas containing phosphorus (P), for example, at 1150° C. with a chamber internal pressure of 150 Torr (about 2.00×10⁴ Pa).

Then, a second oxide layer having a thickness of about 75 nm is formed over the first oxide layer by ECR-pCVD at about 300° C.

Thereafter, the structure is annealed for about 1 hour in an inert gas atmosphere (e.g., Ar atmosphere) at a temperature equal to or higher than 900° C. and equal to or lower than 1100° C. (e.g., 1000° C.).

Figure 12:
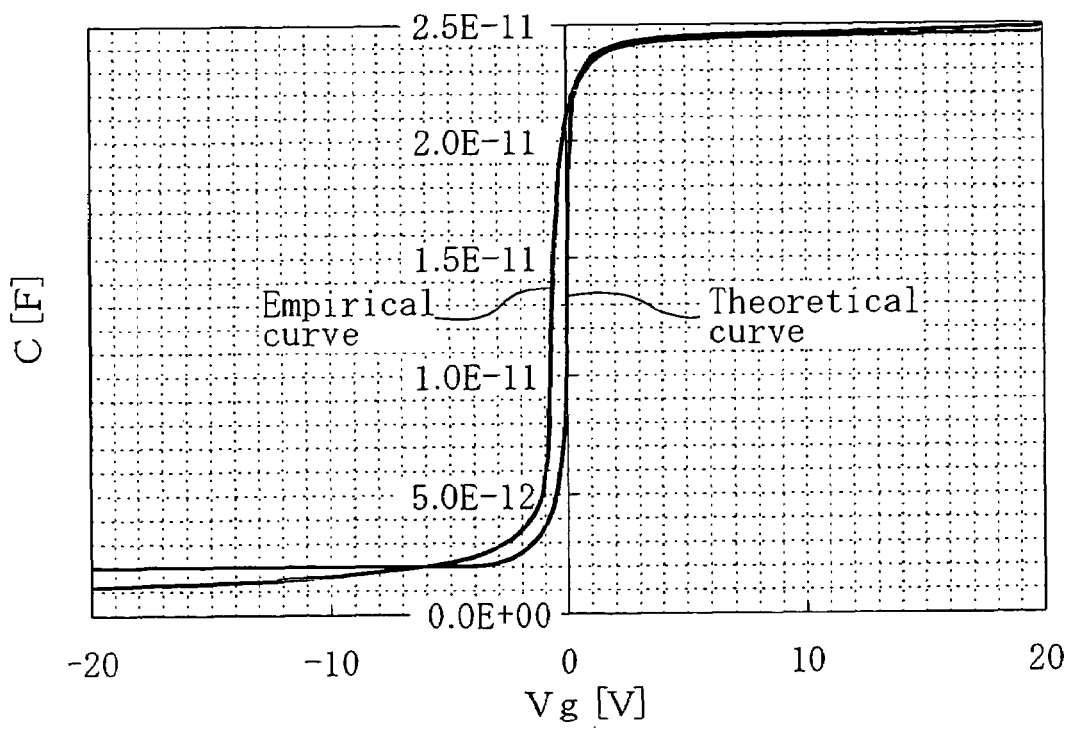
FIG. 12 shows a result of CV measurement performed on a MIS capacitor which includes a V-group element containing oxide layer formed according to the method of embodiment 2 as a capacitance insulating film.

FIG. 12 shows a result of CV measurement performed on a MIS capacitor which includes a V-group element containing oxide layer formed according to the method of embodiment 2 as a capacitance insulating film. In the graph of FIG. 12, the horizontal axis indicates the voltage between electrodes, and the vertical axis indicates the capacitance. Comparing an empirical curve and a theoretical curve in FIG. 12, it is seen that the difference between these curves is very small, i.e., the interface state density was decreased.

Thus, also with the method of embodiment 2, the interface state density is decreased due to the V-group element containing oxide layer consisting of the first and second oxide layers. As a result, the effects described in embodiment 1 are also achieved in embodiment 2.

According to the production method of embodiment 2, even when a V-group element containing oxide layer thicker than 40 nm is formed, a high quality silicon carbide-oxide layered structure is obtained.

A silicon carbide-oxide layered structure and a production method thereof according to the present invention can be used for the production of a vertical or horizontal MISFET power device or a MIS capacitor.

What is claimed is:

1. A method for forming a silicon carbide-oxide layered structure, comprising:
   step (a) of forming a SiO₂ layer on a surface of a silicon carbide layer; and
   after step (a), step (b) of placing the structure formed at step (a) in a chamber and exposing the SiO₂ layer to an atmosphere consisting of an inert gas and a gas selected from the group consisting of NO gas and N₂O gas at a temperature higher than 1100° C. and lower than 1250° C. such that the SiO₂ layer changes into nitrogen containing oxide layer which has the relative dielectric constant of 3.0 or higher,
   wherein step (b) is performed, while flowing the gas selected from the group consisting of NO gas and N₂O gas into the chamber, in an atmosphere where the pressure of the atmosphere is the atmospheric pressure, and the partial pressure of the gas selected from the group consisting of NO gas and N₂O gas is equal to or higher than $6.67 \times 10^3$ Pa and equal to or lower than $5.33 \times 10^4$ Pa.

2. A method for forming a silicon carbide-oxide layered structure, comprising:
   step (a) of forming a first SiO₂ layer on a surface of a silicon carbide layer;
   after step (a), step (b) of placing the structure formed at step (a) in a chamber and exposing the first SiO₂ layer to a gas atmosphere consisting of a gas selected from the group consisting of NO gas and N₂O gas;
   after step (b), step (c) of forming a second SiO₂ layer on the nitrided first SiO₂ layer; and
   after step (c), step (d) of annealing the structure formed at step (c) at a temperature equal to or higher than 900° C. and equal to or lower than 1100° C. in an inert gas atmosphere such that a SiO₂ layer including the first and second SiO₂ layers changes into nitrogen containing oxide layer which has the relative dielectric constant of 3.0 or higher,
   wherein step (b) is performed, while flowing the gas selected from the group consisting of NO gas and N₂O gas into the chamber, in a reduced pressure atmosphere equal to or higher than $6.67 \times 10^3$ Pa and equal to or lower than $5.33 \times 10^4$ Pa.

3. The method of claim 2, wherein step (a) includes the step of forming a thermal oxide film having a thickness smaller than 20 nm.

* * * * *